United States Patent
Park et al.

(10) Patent No.: US 10,996,504 B2
(45) Date of Patent: May 4, 2021

(54) DISPLAY DEVICE AND DRIVING METHOD THEREOF

(71) Applicant: SAMSUNG DISPLAY CO., LTD., Yongin-si (KR)

(72) Inventors: Se Hyuk Park, Yongin-si (KR); Hyo Jin Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/031,429

(22) Filed: Jul. 10, 2018

(65) Prior Publication Data

US 2019/0204670 A1 Jul. 4, 2019

(30) Foreign Application Priority Data

Dec. 29, 2017 (KR) .................... 10-2017-0183609

(51) Int. Cl.
*G09G 3/32* (2016.01)
*G02F 1/1335* (2006.01)
*G02F 1/13357* (2006.01)
*F21V 8/00* (2006.01)
*H01L 25/075* (2006.01)

(52) U.S. Cl.
CPC ..... *G02F 1/133514* (2013.01); *G02B 6/0068* (2013.01); *G02F 1/133609* (2013.01); *G02F 1/133621* (2013.01); *G09G 3/32* (2013.01); *H01L 25/0753* (2013.01); *G09G 2300/0452* (2013.01); *G09G 2300/0842* (2013.01); *G09G 2300/0861* (2013.01); *G09G 2300/0866* (2013.01); *G09G 2310/0235* (2013.01); *G09G 2320/0242* (2013.01)

(58) Field of Classification Search
CPC ...... G09G 3/34; G09G 3/3406; G09G 3/3413; G09G 3/342; G09G 3/3426
See application file for complete search history.

(56) References Cited

U.S. PATENT DOCUMENTS

2002/0008628 A1* 1/2002 Sadjadi ................ G08B 5/36
340/638
2003/0034966 A1* 2/2003 Kim ..................... G09G 3/14
345/211
2010/0171690 A1* 7/2010 Park ..................... G09G 3/3413
345/102

(Continued)

FOREIGN PATENT DOCUMENTS

KR 1020080033018 A 4/2008
KR 101718382 B1 3/2017

*Primary Examiner* — Sepehr Azari
(74) *Attorney, Agent, or Firm* — Kile Park Reed & Houtteman PLLC

(57) ABSTRACT

A display device includes a first pixel including a first light emitting diode ("LED") and a second LED having a color different from that of the first LED, a second pixel including a third LED having a same color as that of the first LED, a third pixel including a fourth LED having a same color as that of the first LED, and a color filter layer including a first color filter located on the first pixel, a second color filter that has a color different from a color of the first color filter and is located on the second pixel, and a third color filter that has a color different from the colors of the first and second color filters and is located on the third pixel.

17 Claims, 4 Drawing Sheets

(56) References Cited

U.S. PATENT DOCUMENTS

| | | | |
|---|---|---|---|
| 2013/0321495 A1* | 12/2013 | Yoshizawa | G02F 1/133621 345/691 |
| 2013/0342589 A1* | 12/2013 | Jung | G09G 3/32 345/690 |
| 2014/0247200 A1* | 9/2014 | Jinta | H01L 25/048 345/76 |
| 2015/0221260 A1* | 8/2015 | Cho | G09G 3/3413 345/691 |
| 2015/0340410 A1* | 11/2015 | Hack | H01L 51/5265 257/40 |
| 2016/0161802 A1* | 6/2016 | Kwon | G02F 1/133621 362/97.3 |
| 2016/0218150 A1* | 7/2016 | Hack | H01L 27/3206 |
| 2017/0004782 A1* | 1/2017 | Fan | G02F 1/133603 |

* cited by examiner

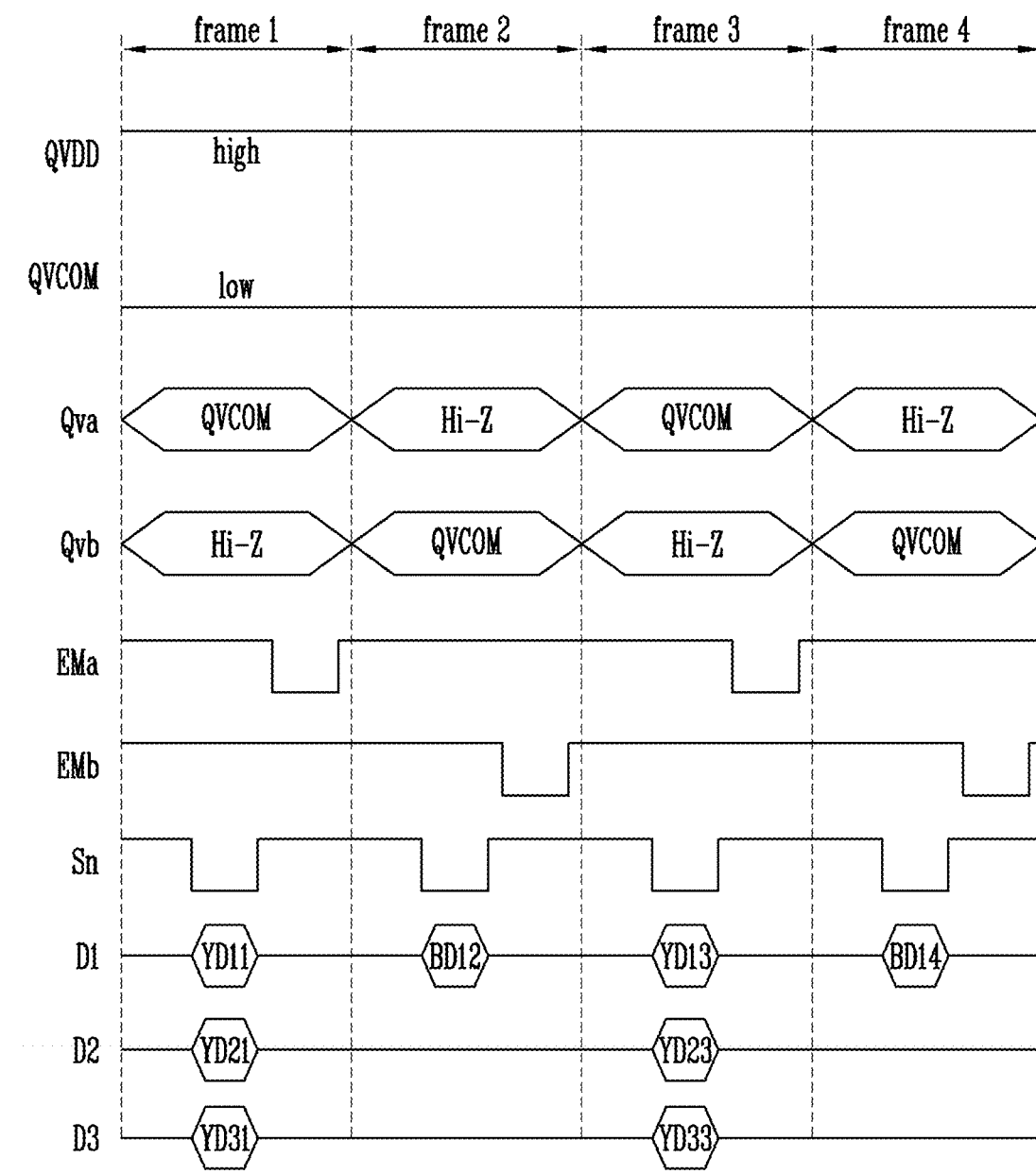

DISPLAY DEVICE AND DRIVING METHOD THEREOF

The application claims priority to Korean patent application 10-2017-0183609, filed on Dec. 29, 2017, and all the benefits accruing therefrom under 35 U.S.C. § 119, the content of which in its entirety is herein incorporated by reference.

BACKGROUND

1. Field

Exemplary embodiment of the invention relate to a display device and a driving method thereof.

2. Description of the Related Art

With a development of information technologies, an importance of a display device which is a connection medium between a user and information increases. Accordingly, display devices such as a liquid crystal display device, an organic light emitting display device, and a plasma display panel are increasingly used.

Recently, light transmissivity of the liquid crystal display device increases and lower power consumption of the liquid crystal display device is achieved, using white color filters rather than blue color filters.

SUMMARY

Display devices using white color filters rather than blue color filters desire a blue frame in which a blue backlight emits light so as to express blue. In this case, there occurs a color breakdown phenomenon that the blue frame and other color frames are temporarily and spatially desynchronized due to a slow response speed of liquid crystals.

Exemplary embodiments provide a display device capable of preventing a color breakdown phenomenon even while using a white color filter, and a driving method of the display device.

According to an exemplary embodiment of the invention, there is provided a display device including a first pixel including a first light emitting diode ("LED") and a second LED having a color different from a color of the first LED, a second pixel including a third LED having a same color as that of the first LED, a third pixel including a fourth LED having a same color as that of the first LED, and a color filter layer including a first color filter located on the first pixel, a second color filter that has a color different from a color of the first color filter and is located on the second pixel, and a third color filter that has a color different from the colors of the first and second color filters and is located on the third pixel.

The first LED, the third LED, and the fourth LED may emit light in a first frame.

In an exemplary embodiment, the second LED may emit light in a second frame different from the first frame.

In an exemplary embodiment, in the first pixel, an anode of the first LED may be coupled to a cathode of the second LED, and a cathode of the first LED may be coupled to an anode of the second LED.

In an exemplary embodiment, in the first pixel, the cathode of the first LED may be coupled to a first power line, and the cathode of the second LED may be coupled to a second power line different from the first power line.

In an exemplary embodiment, the first pixel may further include a first transistor including a first end coupled to a third power line different from the first and second power lines, and a second transistor including a first end coupled to a second end of the first transistor and the other end coupled to the anode of the first LED.

In an exemplary embodiment, the first pixel may further include a third transistor including a first end coupled to the second end of the first transistor and a second end coupled to the anode of the second LED.

In an exemplary embodiment, the first pixel may further include a fourth transistor including a first end coupled to a first data line and a second end coupled to a gate electrode of the first transistor, and a storage capacitor coupling the gate electrode of the first transistor and the third power line.

In an exemplary embodiment, the first power line may have a predetermined voltage value in a first frame and be floated in a second frame different from the first frame. The second power line may be floated in the first frame and have a predetermined voltage value in the second frame.

In an exemplary embodiment, the second transistor and the third transistor may be turned on at different times.

In an exemplary embodiment, the first data line coupled to the first pixel may supply a data voltage in the first frame and the second frame, and a second data line coupled to the second pixel and a third data line coupled to the third pixel may supply data voltages in only the first frame.

In an exemplary embodiment, in the second pixel, a cathode of the third LED may be coupled to the first power line.

In an exemplary embodiment, in the third pixel, a cathode of the fourth LED may be coupled to the first power line.

According to an exemplary embodiment of the invention, there is provided a method for driving a display device, the method including allowing a first LED, a second LED, and a third LED, which have a same color with one another, to emit light in a first frame, and allowing a fourth LED having a color different from the color of the first LED to emit light in a second frame different from the first frame, where an anode of the first LED is coupled to a cathode of the fourth LED, and a cathode of the first LED is coupled to an anode of the fourth LED.

In an exemplary embodiment, the first LED and the fourth LED may be covered with a first color filter. The second LED may be covered with a second color filter having a color different from a color of the first color filter. The third LED may be covered with a third color filter having a color different from the colors of the first and second color filters.

Each of the cathode of the first LED, a cathode of the second LED, and a cathode of the third LED may be coupled to a first power line, and the cathode of the fourth LED may be coupled to a second power line. The first power line may have a predetermined voltage value in a first frame and be floated in a second frame different from the first frame. The second power line may be floated in the first frame and have a predetermined voltage value in the second frame.

BRIEF DESCRIPTION OF THE DRAWINGS

Exemplary embodiments will now be described more fully hereinafter with reference to the accompanying drawings. However, they may be embodied in different forms and should not be construed as limited to the exemplary embodiments set forth herein. Rather, these embodiments are provided so that this invention will be thorough and complete, and will fully convey the scope of the exemplary embodiments to those skilled in the art.

FIG. 6 is a diagram illustrating an exemplary embodiment of a driving method of the display device according to the invention.

DETAILED DESCRIPTION

Figure 1:
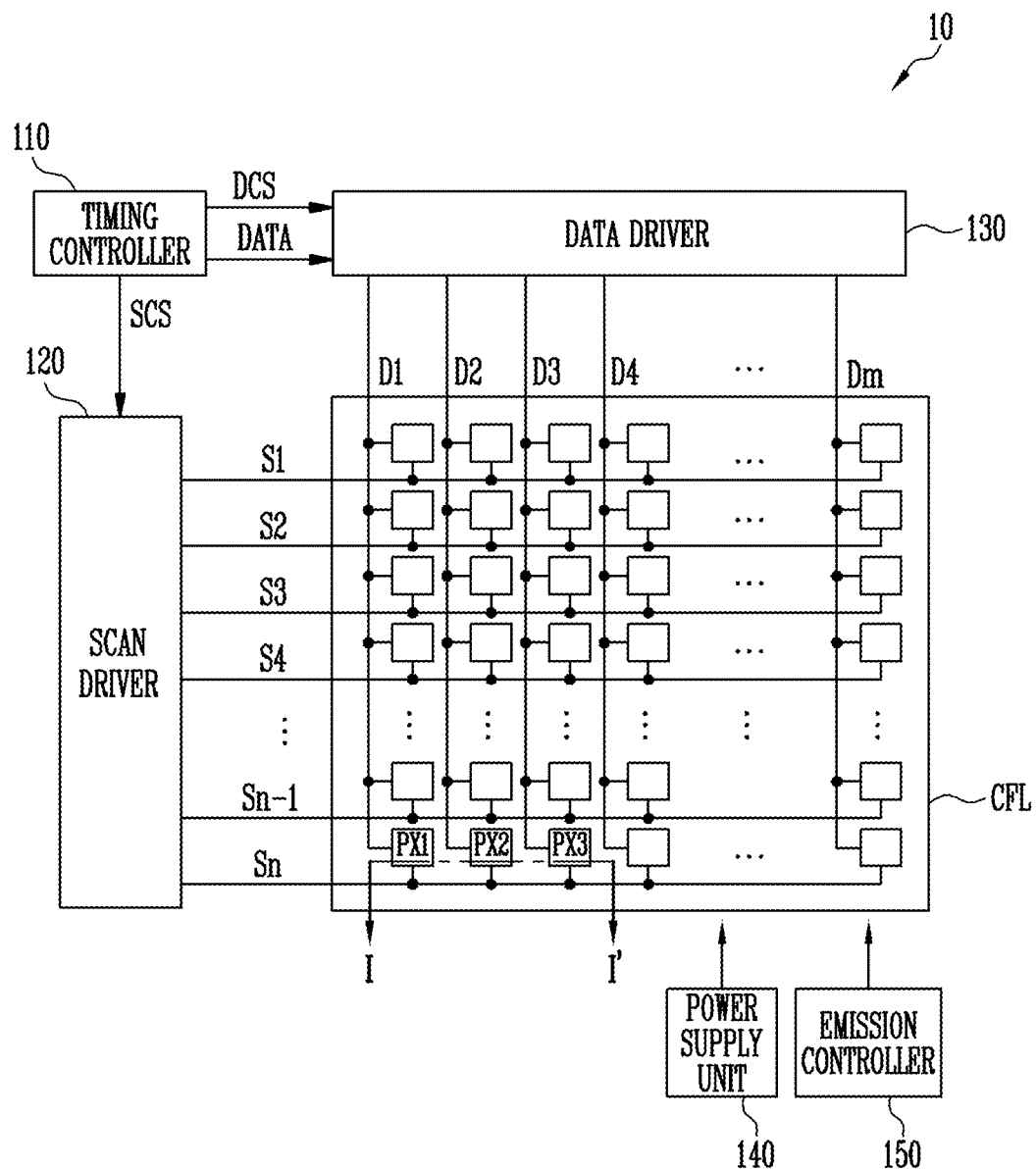
FIG. 1 is a diagram illustrating an exemplary embodiment of a display device according to the invention.

Hereinafter, exemplary embodiments are described in detail with reference to the accompanying drawings so that those skilled in the art may easily practice the invention. The invention may be implemented in various different forms and is not limited to the exemplary embodiments described in the specification.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

A part irrelevant to the description will be omitted to clearly describe the invention, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the invention is not limited thereto. Thicknesses of several portions and regions are exaggerated for clear expressions.

FIG. 1 is a diagram illustrating a display device according to an exemplary embodiment of the invention.

Referring to FIG. 1, the display device 10 according to the exemplary embodiment of the invention includes a timing controller 110, a scan driver 120, a data driver 130, a power supply unit 140, an emission controller 150, a plurality of pixels PX1, PX2, PX3, . . . , and a color filter layer CFL.

The timing controller 110 transmits, to the data driver 130, an image signal DATA corrected suitable for specifications of the data driver 130, using a data enable signal, a vertical synchronization signal, a horizontal synchronization signal, an image signal, and the like, which are received from an external application processor ("AP"), etc., and transmits corresponding control signals DCS and SCS respectively to the data driver 130 and the scan driver 120.

The data driver 130 supplies a data voltage to the plurality of pixels PX1, PX2, PX3, . . . . Specifically, the data driver 130 may apply a plurality of data voltages generated based on a data control signal DCS and the corrected image signal DATA to a plurality of data lines D1, D2, D3, D4, . . . , and Dm where m is a natural number.

The scan driver 120 supplies a scan signal to the plurality of pixels PX1, PX2, PX3, . . . . Specifically, the scan driver 120 may supply a plurality of scan signals to a plurality of scan lines S1, S2, S3, S4, . . . , Sn−1, and Sn in response to a scan control signal SCS where n is a natural number. In an exemplary embodiment, the scan driver 120 may sequentially supply the plurality of scan signals to the plurality of scan lines S1, S2, S3, S4, . . . , Sn−1, and Sn, for example.

Each of the plurality of pixels PX1, PX2, PX3, . . . may emit light with a gray scale corresponding to each data voltage. Each of the plurality of pixels PX1, PX2, PX3, . . . may be coupled to a corresponding data line among the data lines D1, D2, D3, D4, . . . , and Dm and a corresponding scan line among the scan lines S1, S2, S3, S4, . . . , Sn−1, and Sn, and be supplied with a data voltage and a scan signal through the corresponding data line among the data lines D1, D2, D3, D4, . . . , and Dm and the corresponding scan line among the scan lines S1, S2, S3, S4, . . . , Sn−1, and Sn.

In this exemplary embodiment, each pixel includes a light emitting diode ("LED"), and does not include any liquid crystal layer. A predetermined pixel may include two LEDs. This will be described in more detail with reference to the following drawings (e.g., FIG. 2).

The color filter layer CFL may include a plurality of color filters corresponding to a plurality of colors. The plurality of color filters may be located on the plurality of pixels PX1, PX2, PX3, . . . . The corresponding relationship between the color filter and the pixel will be described in more detail with reference to the following drawings (e.g., FIG. 2).

The power supply unit 140 provides a plurality of voltage sources desired to drive the plurality of pixels PX1, PX2, PX3, . . . and power lines extending from the plurality of voltage sources. This will be described in more detail with reference to the following drawings (e.g., FIG. 3).

The emission controller 150 controls emission times of the plurality of pixels PX1, PX2, PX3, . . . , and provides a first emission control line and a second emission control line. In the following drawings (e.g., FIG. 3), for convenience of description, the emission controller 150 is configured as a simultaneous emission type emission controller that allows emission periods of a plurality of pixel rows to be the same. However, in another exemplary embodiment, the emission controller 150 may be configured as a sequential emission type emission controller that allows emission periods of a plurality of pixel rows to be sequentially started.

Figure 2:
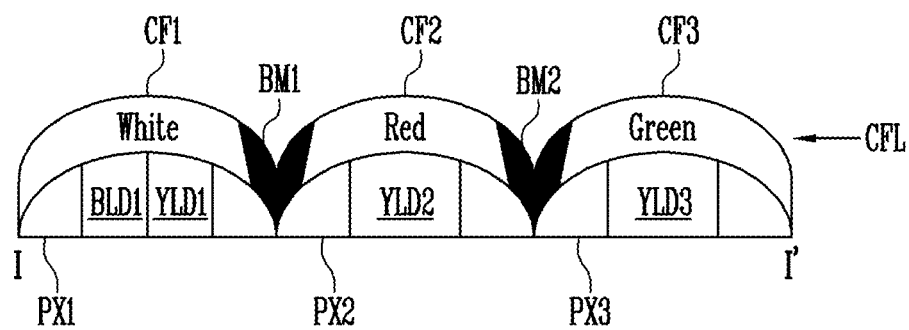
FIG. 2 is a diagram illustrating an exemplary embodiment of pixels and a color filter layer according to the invention.

FIG. 2 is a diagram illustrating pixels and a color filter layer according to an exemplary embodiment of the invention.

Referring to FIG. 2, there is illustrated a section of pixels PX1, PX2, and PX3 and the color filter layer CFL, which correspond to line I-I' of FIG. 1.

A first pixel PX1 includes an LED YLD1 and an LED BLD1 having a color different from that of the LED YLD1. In an exemplary embodiment, the LED YLD1 may be a yellow LED, and the LED BLD1 may be a blue LED, for example.

A second pixel PX2 includes an LED YLD2 having the same color as that of the LED YLD1. In an exemplary embodiment, the LED YLD2 may be a yellow LED, for example.

A third pixel PX3 includes an LED YLD3 having the same color as that of the LED YLD1. In an exemplary embodiment, the LED YLD3 may be a yellow LED, for example.

The color filter layer CFL includes a first color filter CF1 located on the first pixel PX1, a second color filter CF2 that has a color different from that of the first color filter CF1 and is located on the second pixel PX2, and a third color filter CF3 that has a color different from those of the first and second color filters CF1 and CF2 and is located on the third pixel PX3.

In an exemplary embodiment, the first color filter may be a white color filter, the second color filter may be a red color filter, and the third color filter CF3 may be a green color filter, for example.

In an exemplary embodiment, the color filter layer CFL may further include a black matrix BM1 between the first color filter CF1 and the second color filter CF2, to prevent mixture of colors. Also, the color filter layer CFL may further include a black matrix BM2 between the second color filter CF2 and the third color filter CF3, to prevent mixture of colors.

In some exemplary embodiments, black matrixes for preventing mixture of colors may be further included between the respective pixels PX1, PX2, and PX3.

In an exemplary embodiment, multiple colors based on yellow may be expressed as the LED YLD1, YLD2, and YLD3 emit lights in a first frame, and a blue may be expressed as the LED BLD1 emits light in a second frame different from the first frame. The frame in which the multiple colors based on the yellow are expressed and the frame in which the blue is expressed are alternately displayed in the display device 10, so that a final image viewed by a user may have natural colors.

As will be described later with reference to the following drawings (e.g., FIG. 3), the display device 10 according to this exemplary embodiment does not include any liquid crystal layer, and includes an LED that may be independently driven for each pixel, so that color breakdown may be prevented while using a white color filter.

Further, in the first pixel PX1, two LEDs are time-divisionally driven using one pixel circuit, so that it is advantage to ensure the resolution of the display device 10.

Figure 3:
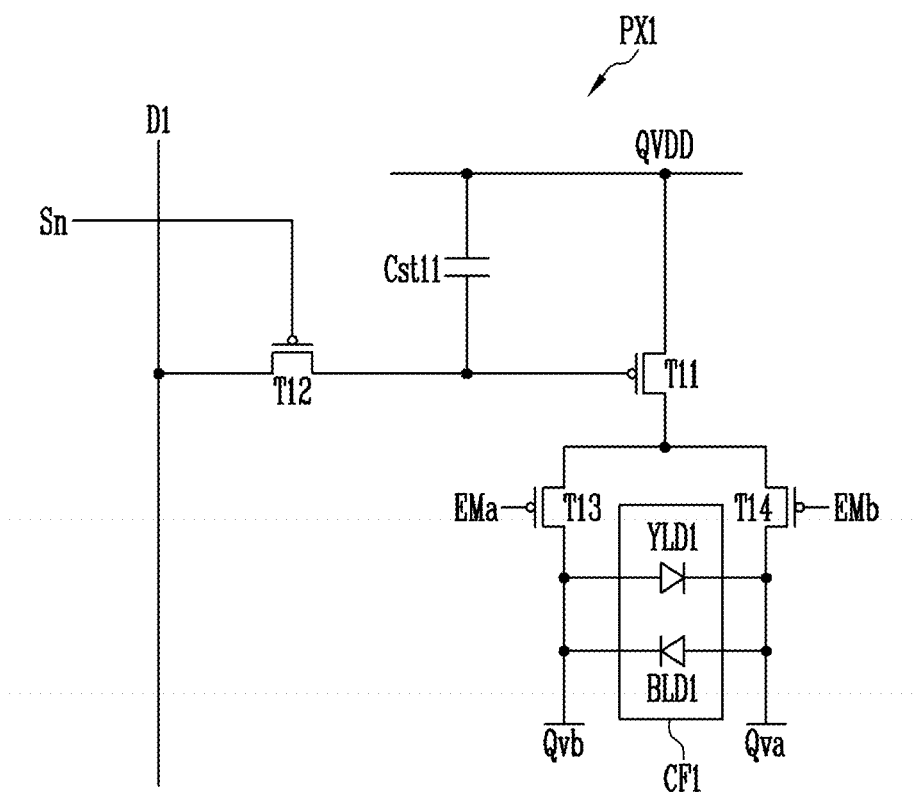
FIG. 3 is a diagram illustrating an exemplary embodiment of a first pixel according to the invention.

FIG. 3 is a diagram illustrating a first pixel according to an exemplary embodiment of the invention.

Referring to FIG. 3, the first pixel PX1 according to the exemplary embodiment of the invention includes a plurality of transistors T11, T12, T13, and T14, a storage capacitor Cst11, and two LEDs YLD1 and BLD1.

Hereinafter, the transistors are illustrated as P-type transistors, but those skilled in the art may design a pixel circuit that performs the same function, using N-type transistors.

One end of the transistor T11 is coupled to a power line QVDD, the other end of the transistor T11 is coupled to one ends of the transistors T13 and T14, and a gate electrode of the transistor T11 is coupled to the other end of the transistor T12.

One end of the transistor T12 is coupled to a data line D1, the other end of the transistor T12 is coupled to the gate electrode of the transistor T11, and a gate electrode of the transistor T12 is coupled to a scan line Sn.

The storage capacitor Cst11 couples the gate electrode of the transistor T11 and the power line QVDD.

The one end of the transistor T13 is coupled to the other end of the transistor T11, the other end of the transistor T13 is coupled to an anode of the LED YLD1, and a gate electrode of the transistor T13 is coupled to a first emission control line EMa. The first emission control line EMa may extend from the emission controller 150 to supply a first emission control signal to the first pixel PX1.

The one end of the transistor T14 is coupled to the other end of the transistor T11, the other end of the transistor T14 is coupled to an anode of the LED BLD1, and a gate electrode of the transistor T14 is coupled to a second emission control line EMb. The second emission control line EMb may extend from the emission controller 150 to supply a second emission control signal to the first pixel PX1.

The LED YLD1 and the LED BLD1 may be coupled in parallel in directions opposite to each other. The LED YLD1 and the LED BLD1 may be LEDs having different colors. In an exemplary embodiment, the LED YLD1 may be a yellow LED, and the LED BLD1 may be a blue LED, for example. In an exemplary embodiment, the LED YLD1 and the LED BLD1 may be nano LEDs. In another exemplary embodiment, the LED YLD1 and the LED BLD1 may be organic LEDs ("OLEDs").

More specifically, the anode of the LED YLD1 may be coupled to a cathode of the LED BLD1, and a cathode of the LED YLD1 may be coupled to the anode of the LED BLD1.

In addition, the cathode of the LED YLD1 may be coupled to a power line Qva, and the cathode of the LED BLD1 may be coupled to a power line Qvb.

Referring back to FIG. 1, the power supply unit 140 may include a plurality of voltage sources. In an exemplary embodiment, the power supply unit 140 may include a high voltage source and a low voltage source, for example. The high voltage source may apply a high voltage to the power line QVDD. The low voltage source may apply a low voltage alternately to the power line Qva and the power line Qvb. Therefore, for example, the power line Qva may have a predetermined voltage value in a first frame and be floated in a second frame different from the first frame. The power line Qvb may be floated in the first frame and have a predetermined voltage value in the second frame.

A driving method of the first pixel PX1 will be described later with reference to FIG. 6.

Figure 4:
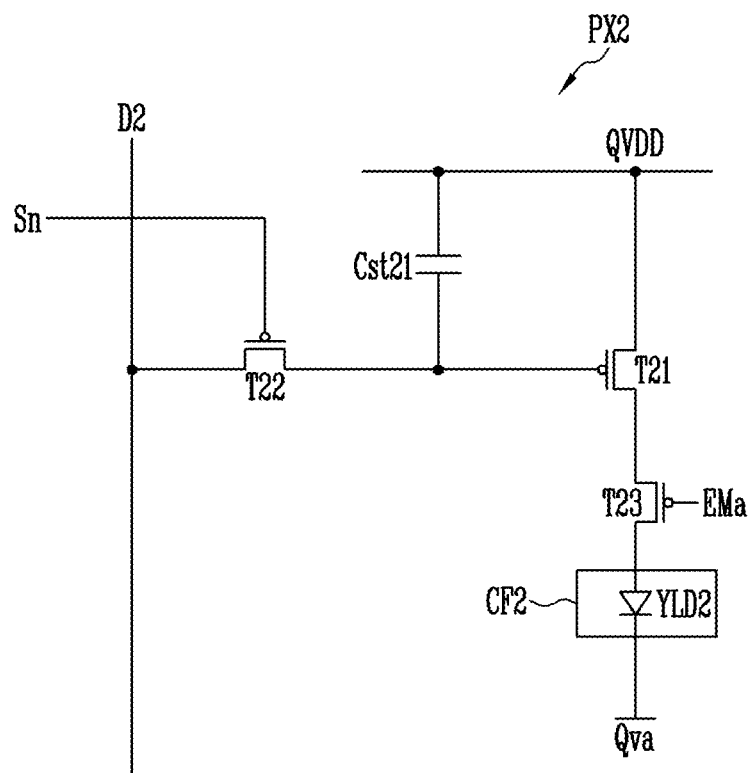
FIG. 4 is a diagram illustrating an exemplary embodiment of a second pixel according to the invention.

FIG. 4 is a diagram illustrating a second pixel according to an exemplary embodiment of the invention.

Referring to FIG. 4, the second pixel PX2 according to the exemplary embodiment of the invention includes a plurality of transistors T21, T22, and T23, a storage capacitor Cst21, and an LED YLD2.

One end of the transistor T21 is coupled to the power line QVDD, the other end of the transistor T21 is coupled to one end of the transistor T23, and a gate electrode of the transistor T21 is coupled to the other end of the transistor T22.

One end of the transistor T22 is coupled to a data line D2, the other end of the transistor T22 is coupled to the gate electrode of the transistor T21, and a gate electrode of the transistor T22 is coupled to the scan line Sn.

The storage capacitor Cst21 couples the gate electrode of the transistor T21 and the power line QVDD.

The one end of the transistor T23 is coupled to the LED YLD2, the other end of the transistor T23 is coupled to the other end of the transistor T21, and a gate electrode of the transistor T23 is coupled to a first emission control line EMa.

An anode of the LED YLD2 is coupled to the other end of the transistor T23, and a cathode of the LED YLD2 is coupled to the power line Qva. In some exemplary embodiments, the cathode of the LED YLD2 may be directly coupled to the low voltage source instead of the power line Qva. In an exemplary embodiment, the LED YLD2 may be a yellow LED, for example.

A driving method of the second pixel PX2 will be described later with reference to FIG. 6.

Figure 5:
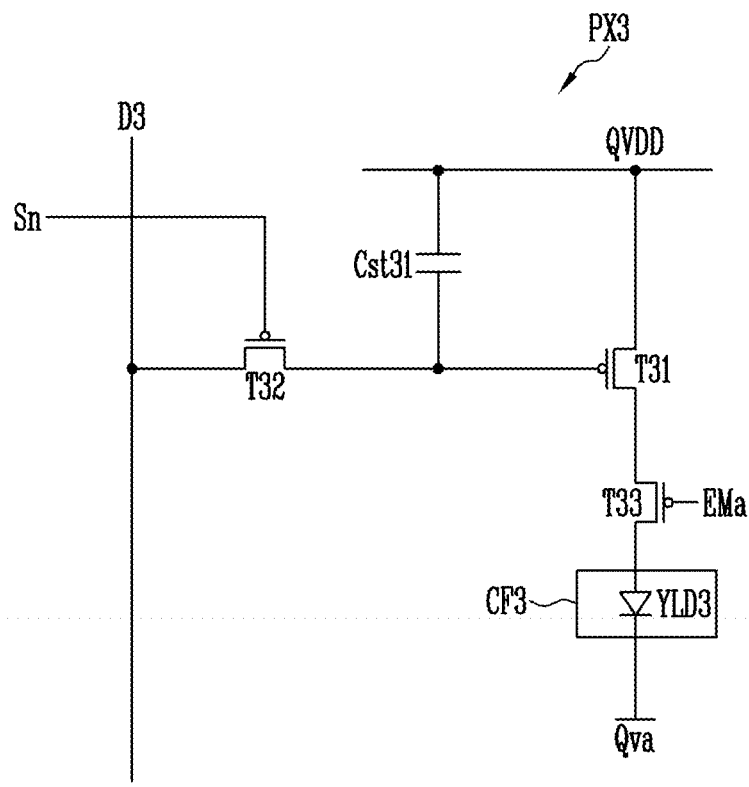
FIG. 5 is a diagram illustrating an exemplary embodiment of a third pixel according to the invention.

FIG. 5 is a diagram illustrating a third pixel according to an exemplary embodiment of the invention.

Referring to FIG. 5, the third pixel PX3 according to the exemplary embodiment of the invention includes a plurality of transistors T31, T32, and T33, a storage capacitor Cst31, and an LED YLD3.

One end of the transistor T31 is coupled to the power line QVDD, the other end of the transistor T31 is coupled to one end of the transistor T33, and a gate electrode of the transistor T31 is coupled to the other end of the transistor T32.

One end of the transistor T32 is coupled to a data line D3, the other end of the transistor T32 is coupled to the gate electrode of the transistor T31, and a gate electrode of the transistor T32 is coupled to the scan line Sn.

The storage capacitor Cst31 couples the gate electrode of the transistor T31 and the power line QVDD.

The one end of the transistor T33 is coupled to the LED YLD3, the other end of the transistor T33 is coupled to the other end of the transistor T31, and a gate electrode of the transistor T33 is coupled to a first emission control line EMa.

An anode of the LED YLD3 is coupled to the other end of the transistor T23, and a cathode of the LED YLD3 is coupled to the power line Qva. In some exemplary embodiments, the cathode of the LED YLD3 may be directly coupled to the low voltage source instead of the power line Qva. In an exemplary embodiment, the LED YLD3 may be a yellow LED, for example.

A driving method of the third pixel PX3 will be described later with reference to FIG. 6.

FIG. 6 is a diagram illustrating a driving method of the display device according to an exemplary embodiment of the invention.

Referring to FIG. 6, there are illustrated signal values supplied to the respective pixels PX1, PX2, and PX3 in exemplary four frames.

Frame 1 and frame 2 may be combined to display one image screen, and frame 3 and frame 4 may be combined to display a next image screen. In some exemplary embodiments, the frame 1 may be a multi-frame based on yellow, and the frame 2 may be a blue frame. In addition, the frame 3 may be a multi-frame based on yellow, and the frame 4 may be a blue frame.

First, in the frame 1, the power line Qva is coupled to the low voltage source, and a low voltage value QVCOM is applied to the power line Qva. At this time, the power line Qvb is in a floated state. For example, the power line Qvb is coupled to a high-impedance Hi-Z.

Next, a scan signal having a turn-on level (low level) is supplied through the scan line Sn. Thus, the transistors T12, T22, and T32 are in a turn-on state, so that the data lines D1, D2, and D3 and the gate electrodes of the transistors T11, T21, and T32 are electrically coupled to each other.

At this time, a data voltage YD11 is supplied to the data line D1, a data voltage YD21 is supplied to the data line D2, and a data voltage YD31 is supplied to the data line D3.

Accordingly, difference values between the respective data voltages YD11, YD21, and YD31 and the high voltage of the power line QVDD are written in the storage capacitors Cst11, Cst21, and Cst31. The transistors T11, T21, and T31 determine the width of a driving current path between the high voltage source and the low voltage source according to the values written in the respective storage capacitors Cst11, Cst21, and Cst31.

Next, a first emission control signal of the turn-on level (low level) is supplied through the first emission control line EMa. Accordingly, the transistors T13, T23, and T33 are in a turn-on state, so that each of the LEDs YLD1, YLD2, and YLD3 emits light. At this time, since a second emission control signal having a turn-off level (high level) is supplied to the second emission control line EMb, the transistor T14 is in a turn-off state, and thus the LED BLD1 does not emit light.

Next, in the frame 2, the power line Qva is in a floated state, and the power line Qvb is coupled to the low voltage source to be applied with the low voltage value QVCOM.

Next, the scan signal having the turn-on level is supplied through the scan line Sn. Thus, the transistors T12, T22, and T32 are in a turn-on state, so that the data lines D1, D2, and D3 and the gate electrodes of the transistors T11, T21, and T31 are electrically coupled to each other.

At this time, a data voltage BD12 is supplied to the data line D1, and any data voltage is not supplied to the data line D2 and the data line D3.

In some exemplary embodiments, a data voltage may be supplied to the data line D2 and the data line D3. At this time, since the transistors T23 and T33 in the frame 2 are maintained in a turn-off state according to the first emission control signal having the high level, each of the LEDs YLD2 and YLD3 does not emit light.

A difference value between the data voltage BD12 and the high voltage of the power line QVDD is written in the storage capacitor Cst11. The transistor T11 determines the width of a driving current path between the high voltage source and the low voltage source according to the value written in the storage capacitor Cst11.

Next, the second emission control signal having the turn-on level is supplied through the second emission control line EMb. Accordingly, the transistor T14 is in a turn-on state, so that the LED BLD1 emits light. At this time, since the first emission control signal having the turn-off level is supplied to the first emission control line EMa, each of the LEDs YLD1, YLD2, and YLD3 does not emit light.

Thus, a user recognizes an image screen having natural colors due to the combination of the frame 1 based on yellow and the frame 2 based on blue.

The frame 3 and the frame 4 respectively correspond to the frame 1 and the frame 2, and therefore, overlapping descriptions will be omitted.

In the display device and the driving method thereof according to the invention, it is possible to prevent a color breakdown phenomenon even while using the white color filter.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:

1. A display device comprising:
    a first self-emissive pixel comprising a first light emitting diode and a second light emitting diode configured to emit light of different colors than one another;
    a second self-emissive pixel comprising a third light emitting diode configured to emit light of a same color as the first light emitting diode;
    a third self-emissive pixel comprising a fourth light emitting diode configured to emit light of a same color as the first light emitting diode; and
    a color filter layer comprising:
    a first color filter on the first self-emissive pixel;
    a second color filter on the second self-emissive pixel, a color of the second color filter being different from a color of the first color filter; and
    a third color filter on the third self-emissive pixel, a color of the third color filter being different from the color of the first color filter and the color of the second color filter, wherein
    the first self-emissive pixel is configured to drive the first light emitting diode and the second light emitting diode in different frames than one another, and
    when the second light emitting diode emits light, the second self-emissive pixel and the third self-emissive pixel do not generate light,
    wherein the first self-emissive pixel includes:
    a first transistor comprising a first end coupled to a third power line different from a first power line and a second power line; and
    a second transistor comprising a first end coupled to a second end of the first transistor and a second end coupled to the anode of the first light emitting diode,
    wherein in the first self-emissive pixel, an anode of the first light emitting diode is coupled to a cathode of the second light emitting diode, a cathode of the first light emitting diode is coupled to an anode of the second light emitting diode, and
    wherein the cathode of the first light emitting diode is coupled to the first power line, and the cathode of the second light emitting diode is coupled to the second power line different from the first power line.

2. The display device of claim 1, wherein the first light emitting diode, the third light emitting diode, and the fourth light emitting diode are configured to emit light in a first frame.

3. The display device of claim 2, wherein the second light emitting diode is configured to emit light in a second frame different from the first frame.

4. The display device of claim 3, wherein:
    a first data line coupled to the first self-emissive pixel is configured to supply a data voltage in the first frame and the second frame, and
    a second data line coupled to the second self-emissive pixel and a third data line coupled to the third self-emissive pixel are configured to supply data voltages in only in the first frame.

5. The display device of claim 1, wherein the first self-emissive pixel further comprises:
    a third transistor comprising a first end coupled to the second end of the first transistor and a second end coupled to the anode of the second light emitting diode.

6. The display device of claim 5, wherein the first self-emissive pixel further comprises:
    a fourth transistor comprising a first end coupled to a first data line and a second end coupled to a gate electrode of the first transistor; and
    a storage capacitor coupling the gate electrode of the first transistor and the third power line.

7. The display device of claim 5, wherein the second transistor and the third transistor are configured to be turned on at different times.

8. The display device of claim 1, wherein:
    the first power line is configured to transmit a predetermined voltage value in a first frame and be floated in a second frame different from the first frame, and
    the second power line is configured to be floated in the first frame and transmit a predetermined voltage value in the second frame.

9. The display device of claim 8, wherein, in the second self-emissive pixel, a cathode of the third light emitting diode is coupled to the first power line.

10. The display device of claim 9, wherein, in the third self-emissive pixel, a cathode of the fourth light emitting diode is coupled to the first power line.

11. The display device of claim 1, wherein the first self-emissive pixel, the second self-emissive pixel, and the third self-emissive pixel are non-liquid crystal pixels.

12. The display device of claim 1, wherein:
the second color filter is configured to change a color of light incident from the third light emitting diode, and
the third color filter is configured to change a color of light incident from the fourth light emitting diode.

13. A method for driving a display device, the method comprising:
causing, at least in part, a first light emitting diode, a second light emitting diode, and a third light emitting diode, which are configured to emit a same color of light as one another, to emit light in a first frame; and
causing, at least in part, a fourth light emitting diode, which is configured to emit a color different from the same color, to emit light in a second frame different from the first frame,
wherein:
an anode of the first light emitting diode is coupled to a cathode of the fourth light emitting diode,
a cathode of the first light emitting diode is coupled to an anode of the fourth light emitting diode,
the cathode of the first light emitting diode is coupled to a first power line, the first power line transmitting a predetermined voltage in the first frame and floated in the second frame, and
the cathode of the fourth light emitting diode is coupled to a second power line different from the first power line, the second power line being floated in the first frame and transmitting a predetermined voltage in the second frame.

14. The method of claim 13, wherein:
the first light emitting diode and the fourth light emitting diode are covered with a first color filter,
the second light emitting diode is covered with a second color filter having a color different from a color of the first color filter, and
the third light emitting diode is covered with a third color filter having a color different from the color of the first color filter and the color of the second color filter.

15. The method of claim 13, wherein each of a cathode of the second light emitting diode and a cathode of the third light emitting diode is coupled to the first power line.

16. A display device comprising:
a plurality of pixels arranged in a first direction; and
a color filter layer overlapping the plurality of pixels in a second direction different from the first direction, wherein the plurality of pixels include:
a first pixel comprising a first light emitting diode and a second light emitting diode configured to emit light of different colors than one another;
a second pixel comprising a third light emitting diode, the first and third light emitting diodes being configured to emit a same color of light as one another; and
a third pixel comprising a fourth light emitting diode, the first and fourth light emitting diodes being configured to emit a same color of light as one another; and
the color filter layer includes:
a first portion overlapping the first and second light emitting diodes;
a second portion overlapping the third light emitting diode, a color of the second portion being configured to change a color of incident light from the third light emitting diode; and
a third portion overlapping the fourth light emitting diode, a color of the third portion being configured to change a color of incident light from the fourth light emitting diode, the color of the third portion being different from the color of the second portion, and wherein the first light emitting diode and the second light emitting diode are arranged in the first direction,
wherein the first pixel includes:
a first transistor comprising a first end coupled to a third power line different from a first power line and a second power line; and
a second transistor comprising a first end coupled to a second end of the first transistor and a second end coupled to the anode of the first light emitting diode,
wherein in the first pixel, an anode of the first light emitting diode is coupled to a cathode of the second light emitting diode, a cathode of the first light emitting diode is coupled to an anode of the second light emitting diode, and
wherein the cathode of the first light emitting diode is coupled to the first power line, and the cathode of the second light emitting diode is coupled to the second power line different from the first power line.

17. The display device of claim 16, wherein:
an anode of the first light emitting diode is coupled to a cathode of the second light emitting diode,
a cathode of the first light emitting diode is coupled to an anode of the second light emitting diode,
the first pixel comprises more light emitting diodes than the second pixel, and
the first pixel comprises more light emitting diodes than the third pixel.

* * * * *